US007911842B2

(12) United States Patent
Park et al.

(10) Patent No.: US 7,911,842 B2
(45) Date of Patent: Mar. 22, 2011

(54) MEMORY CELL PROGRAMMING METHOD AND SEMICONDUCTOR DEVICE FOR SIMULTANEOUSLY PROGRAMMING A PLURALITY OF MEMORY BLOCK GROUPS

(75) Inventors: Ju-hee Park, Guri-si (KR); Jae-woong Hyun, Uijeongbu-si (KR); Yoon-dong Park, Yongin-si (KR); Kyoung-lae Cho, Yongin-si (KR); Sung-jae Byun, Yongin-si (KR); Seung-hwan Song, Incheon (KR); Jun-jin Kong, Yongin-si (KR); Sung-chung Park, Daejeon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 138 days.

(21) Appl. No.: 12/081,568

(22) Filed: Apr. 17, 2008

(65) Prior Publication Data

US 2008/0285343 A1 Nov. 20, 2008

(30) Foreign Application Priority Data

May 14, 2007 (KR) ........................ 10-2007-0046662

(51) Int. Cl.
*G11C 16/04* (2006.01)

(52) U.S. Cl. ......... 365/185.11; 365/185.03; 365/185.28; 365/185.33

(58) Field of Classification Search .............. 365/185.11
See application file for complete search history.

(56) References Cited

U.S. PATENT DOCUMENTS

| | | | | |
|---|---|---|---|---|
| 5,369,619 | A * | 11/1994 | Ohba | 365/230.03 |
| 5,809,225 | A * | 9/1998 | Ohsawa et al. | 714/32 |
| 5,841,721 | A * | 11/1998 | Kwon et al. | 365/218 |
| 5,920,573 | A * | 7/1999 | Dorney | 714/719 |
| 5,926,431 | A * | 7/1999 | Toda | 365/230.03 |
| 5,959,887 | A * | 9/1999 | Takashina et al. | 365/185.13 |
| 5,986,933 | A * | 11/1999 | Takeuchi et al. | 365/185.12 |
| 6,320,791 | B1 * | 11/2001 | Mio | 365/185.22 |
| 6,445,615 | B2 * | 9/2002 | Kobayashi et al. | 365/185.11 |
| 6,457,094 | B2 * | 9/2002 | Zheng | 711/105 |
| 7,505,355 | B2 * | 3/2009 | Kanda et al. | 365/230.06 |
| 2008/0077730 | A1 * | 3/2008 | Kuge | 711/103 |

* cited by examiner

*Primary Examiner* — Son L Mai
(74) *Attorney, Agent, or Firm* — Harness, Dickey & Pierce, P.L.C.

(57) ABSTRACT

Provided are a memory cell programming method and a semiconductor device which may be capable of simultaneously writing a bit of data and then another bit of the data to a plurality of memory blocks. The memory programming method, in which M bits of data are written to a plurality of memory blocks, may include a data division operation and a data writing operation where M may be a natural number. In the data division operation, the plurality of memory blocks may be divided into a plurality of memory block groups. In the data writing operation, an $i^{th}$ bit of the data may be simultaneously written to two or more memory block groups from among the plurality memory block groups, and then an $i+1^{th}$ bit of the data may be simultaneously written to the two or more memory block groups from among the plurality memory block groups, where i is a natural number less than M.

21 Claims, 6 Drawing Sheets

START
SIMULTANEOUSLY WRITE A FIRST BIT OF DATA TO EVERY TWO MEMORY CELL GROUPS — S410
STORE INFORMATION INDICATING THAT THE FIRST BIT HAS BEEN WRITTEN TO THE MEMORY CELL GROUPS — S420
VERIFY THE FIRST BIT BASED ON THE STORED INFORMATION — S430
SIMULTANEOUSLY WRITE A SECOND BIT OF DATA TO EVERY TWO MEMORY CELL GROUPS — S440
STORE INFORMATION INDICATING THAT THE SECOND BIT HAS BEEN WRITTEN TO THE MEMORY CELL GROUPS — S460
VERIFY THE FIRST AND SECOND BITS BASED ON THE STORED INFORMATION — S470
END

MEMORY CELL PROGRAMMING METHOD AND SEMICONDUCTOR DEVICE FOR SIMULTANEOUSLY PROGRAMMING A PLURALITY OF MEMORY BLOCK GROUPS

PRIORITY STATEMENT

This application claims priority under 35 U.S.C. §119 to Korean Patent Application No. 10-2007-0046662, filed on May 14, 2007, in the Korean Intellectual Property Office, the entire contents of which are incorporated herein by reference.

BACKGROUND

1. Field

Example embodiments relate to a memory cell programming method and a semiconductor device, and more particularly, to a memory cell programming method and a semiconductor device capable of simultaneously programming a plurality of memory block groups.

2. Description of Related Art

Non-volatile memory devices that may be electrically erased and programmed may retain data even if supplied power is discontinued. Flash memory may be a representative example of non-volatile memory devices.

Memory cells that constitute flash memory may include a cell transistor having a control gate, a floating gate, a source and a drain. A cell transistor of flash memory may be programmed or erased according to the Fowler-Nordheim (F-N) tunneling mechanism.

Data in a cell transistor may be erased by applying a ground voltage to a control gate of the cell transistor and applying a voltage higher than a power supply voltage to a semiconductor substrate (or bulk). Under such erasing bias conditions, a strong electric field may be formed between a floating gate and the semiconductor bulk due to a large voltage difference between the two. Thus electrons present in the floating gate may be discharged to the semiconductor bulk according to the F-N tunneling mechanism. In example embodiments, the threshold voltage of the erased cell transistor may decrease.

The cell transistor may be programmed by applying a voltage higher than the power supply voltage to the control gate and applying a ground voltage to a drain and the semiconductor bulk. Under such bias conditions, electrons may be injected into the floating gate of the cell transistor according to the F-N tunneling mechanism. In example embodiments, the threshold voltage of the programmed cell transistor may increase.

SUMMARY

Example embodiments may provide a memory cell programming method of simultaneously programming a plurality of memory block groups.

Example embodiments may also provide a semiconductor device for simultaneously programming a plurality of memory block groups.

According to example embodiments, there may be provided a memory programming method in which M bits of data are written to a plurality of memory blocks. The method may comprise: dividing a plurality of memory blocks into a plurality of memory block groups; and writing the data to the memory block groups by simultaneously writing an $i^{th}$ bit of the data to two or more memory block groups from among the memory block groups, and then an $i+1^{th}$ bit of the data to another two or more memory block groups from among the memory block groups, where i is a natural number less than M, and M is a natural number.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DESCRIPTION OF EXAMPLE EMBODIMENTS

Figure 1:
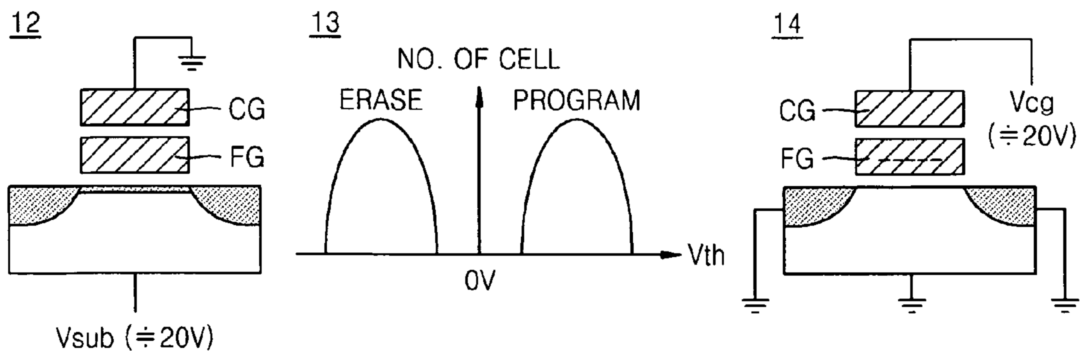
FIG. 1 illustrates the construction and operation of a non-volatile memory cell.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term “and/or” includes any and all combinations of one or more of the associated listed items.

It will be understood that when an element is referred to as being “connected” or “coupled” to another element, it may be directly connected or coupled to the other element or intervening elements may be present. In contrast, when an element is referred to as being “directly connected” or “directly coupled” to another element, there are no intervening elements present. Other words used to describe the relationship between elements should be interpreted in a like fashion (e.g., “between” versus “directly between”, “adjacent” versus “directly adjacent”, etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 illustrates an example of the construction and operation of a non-volatile memory cell. A state in which electrons are injected into a floating gate FG of a memory cell included in a non-volatile memory device may be referred to as a 'programming state', and a state in which electrons do not exist in the floating gate FG may be referred to as an 'erased state'. In detail, FIG. 1 illustrates examples of a memory cell in an 'erased state' 12 and a memory cell in a 'programming state' 14. As illustrated by threshold distribution graph 13, threshold voltage in the programming state may be greater than 0, and a threshold voltage in the erased state may be less than 0.

Recently, research has been actively conducted into the development of a multi-level flash memory which may store two or more bits of data in one memory cell in order to improve the storage density of flash memory. Multi-bits of data, e.g., two or more bits of data, may be stored in a memory cell of a multi-level flash memory. A memory cell that can store multi-bits of data may be referred to as a multi-level cell (MLC), and a memory cell that can store a single bit of data may be referred to as a single-level cell (SLC). The MLC may store two or more bits of data and thus may have four or more threshold voltage distributions and four or more data storing states corresponding to the distributions. A case where two bits of data are stored in a memory cell of an MLC will now be described. However, three or more bits of data may be stored in a memory cell of an MLC.

An MLC that stores two bits of data may have four data storing states, i.e., '11', '01', '10', and '00'. For example, '11' may indicate the erased state, and '01', '10', and '00' may indicate the programming state.

Figure 2:
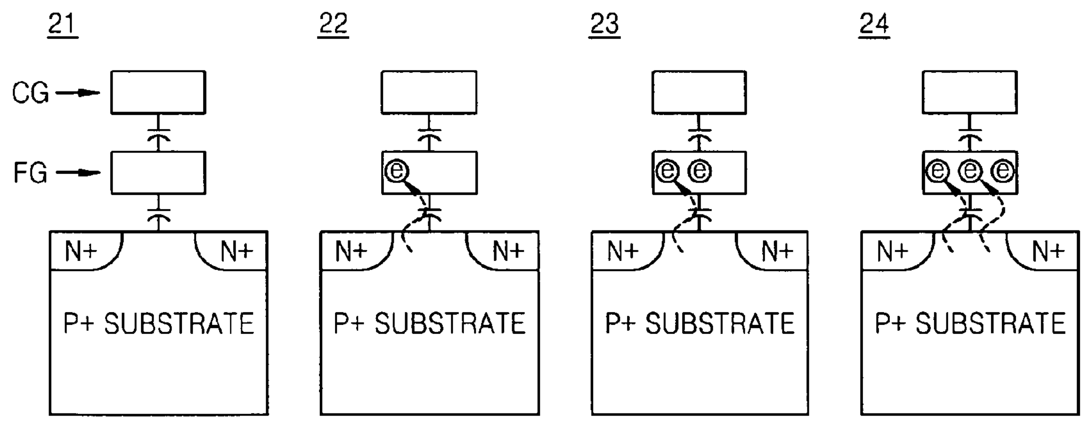
FIG. 2 illustrates the operation of a non-volatile multi-level cell.
Figure 2:
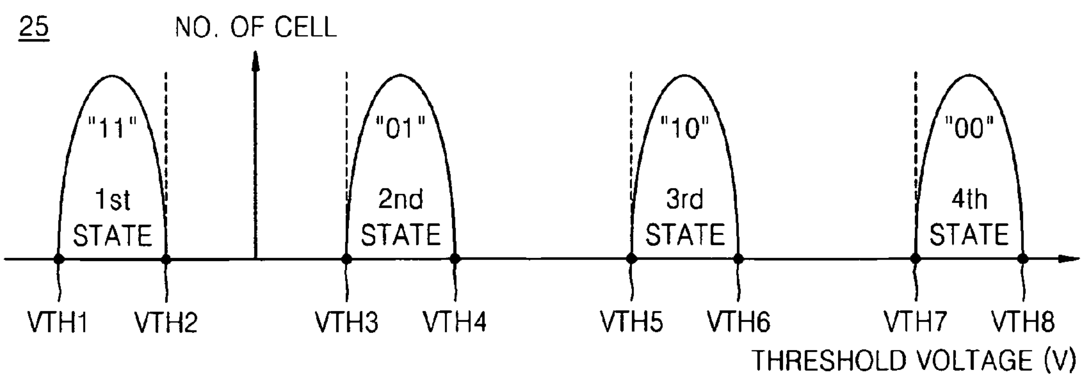

Referring to FIG. 2, the distributions of the four data storing states may correspond to threshold voltage distributions of an MLC. For example, as illustrated by threshold distribution graph 25, if it is assumed that the threshold voltage distributions are VTH1 to VTH2, VTH3 to VTH4, VTH5 to VTH6, and VTH7 to VTH8, the data storing states '11', '01', '10', and '00' may correspond to VTH1 to VTH2, VTH3 to VTH4, VTH5 to VTH6, and VTH7 to VTH8. If a threshold voltage of the MLC corresponds to one of the four threshold voltage distributions, two bits of data corresponding to '11', '01', '10', or '00' may be stored in the MLC.

FIG. 2 illustrates an example of the operation of an MLC of a non-volatile memory device. In detail, FIG. 2 illustrates an example of an erased state 21 in which electrons do not exist in a floating gate FG of the MLC, a first programming state 22 in which some of electrons are injected into the floating gate FG, a second programming state 23 in which more electrons are injected into the floating gate FG, and a third programming state 24 in which a largest number of electrons are injected into the floating gate FG. As is illustrated in threshold distribution graph 25, as a current state goes from the erased state, to the first programming state, to the second programming state, and finally, to the third programming state, a threshold voltage may increase.

In a memory programming method that may be compared to example embodiments, all the bits of data may be sequentially written to a first memory block and then to a second memory block. Writing may be performed on the second memory block after completion of writing to the first memory block. However, with the this method, there may be a restriction to improving the speed of writing since writing may not be performed on the second memory block until writing to the first memory block is completed.

Figure 3:
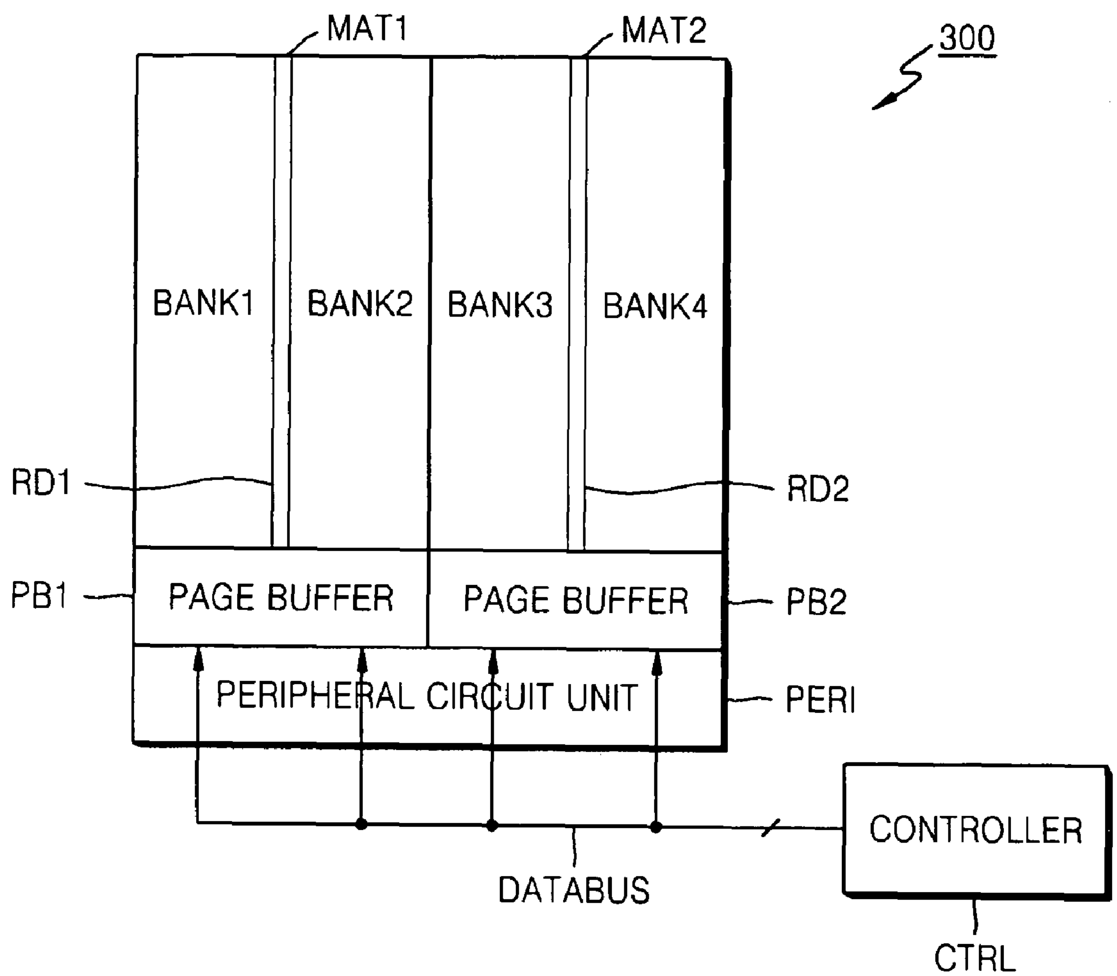
FIG. 3 is a block diagram of a semiconductor device having two mats according to example embodiments.

FIG. 3 is a block diagram of a semiconductor device 300 which may have two mats MAT1 and MAT2 each including at least one memory block. Mat is a kind of memory array, and includes at least one memory block. The semiconductor device 300 may also include a peripheral circuit PERI. Each of the first and second mats MAT1 and MAT2 may include a plurality of banks BANK1 through BANK4 each having at least one memory block. Row decoders RD1 and RD2 may be disposed on the centers of the first and second mats MAT1 and MAT2. However, it would be apparent to those of ordinary skill in the art that the row decoders RD1 and RD2 may be disposed on regions of the first and second mats MAT1 and MAT2, other than the centers thereof. The semiconductor device of FIG. 3 may include a plurality of page buffers PB1 and PB2. The page buffers PB1 and PB2 may correspond to the first and second mats MAT1 and MAT2, and may receive data through a data bus DATABUS and transmit it to the corresponding mats MAT1 and MAT2. The semiconductor device of FIG. 3 may include a controller CTRL. The controller CTRL may control writing data to the memory blocks belonging to the first and second mats MAT1 and MAT2.

In a memory programming method according to example embodiments, a first bit of data may be simultaneously written to a plurality of memory blocks and then a second bit of the data may be simultaneously written to the plurality of memory blocks. For example, a first bit of data may be simultaneously written to the first and second mats MAT1 and MAT2 and then a second bit of the data may be simultaneously written thereto. In contrast, in a memory programming method that may be compared with example embodiments, a first bit and second bit of data may be written to one memory block and then to another memory block. Thus, the memory programming method according to example embodiments may be capable of improving the speed of programming.

A memory programming method according to example embodiments will now be described in greater detail with reference to FIGS. 3 through 6.

Figure 4:
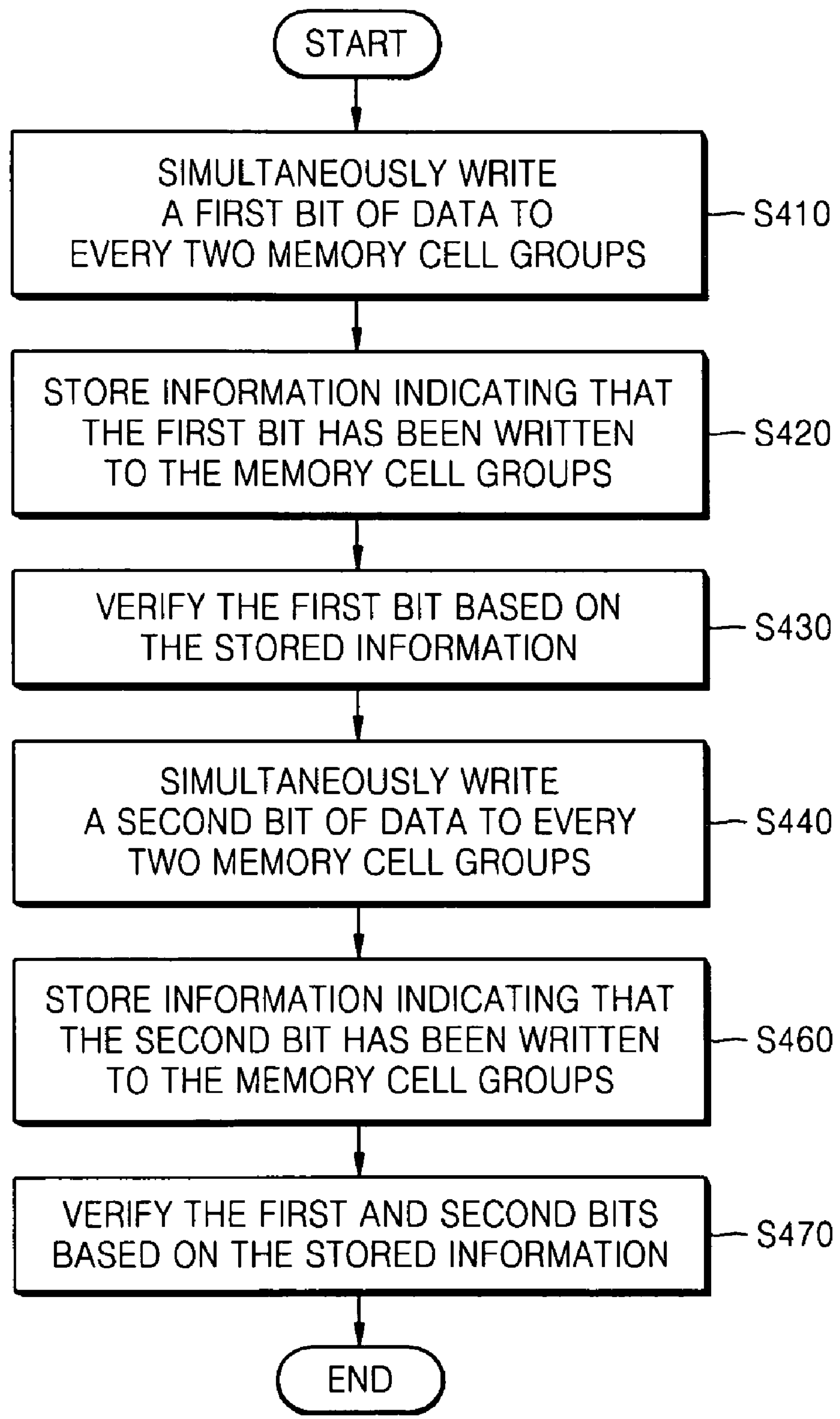
FIG. 4 is a flowchart illustrating a memory programming method according to example embodiments.

FIG. 4 is a flowchart illustrating a memory programming method according to example embodiments. Referring to FIG. 4, several bits of data may be written to a plurality of memory block groups. The memory block groups may each include a plurality of memory blocks and may be the first and second mats MAT1 and MAT2 illustrated in FIG. 3.

Referring to FIG. 4, in the memory programming method, a first bit of data may be simultaneously written to a first memory block group and a second memory block group, e.g., the first and second mats MAT1 and MAT2 (operation S410). Next, a second bit of data may be simultaneously written to the first and second memory block groups (operation S440)

More specifically, the first bit of the data may be simultaneously written to memory blocks belonging to the first and second memory block groups. Then a second bit of the data may be simultaneously written to the memory blocks belonging to the first and second memory block groups. In example embodiments, a desired block that is to be programmed may be selected from among the memory block groups, by using a controller.

After writing the first bit of the data, the second bit of the data may be simultaneously written to the first and second memory block groups. The data may be simultaneously written to a plurality of memory blocks. For example, the data may be written to a plurality of memory blocks belonging to the first memory block group and a plurality of memory blocks belonging to the second memory block group.

Figure 5A:
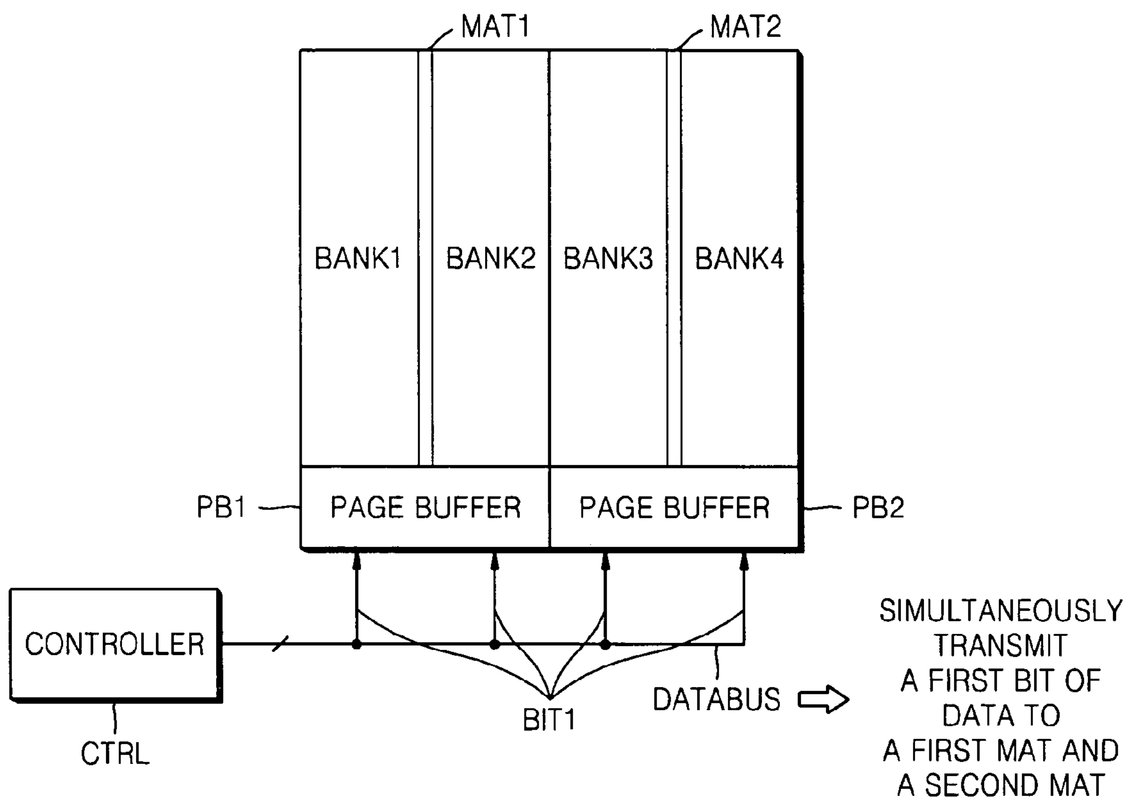
FIGS. 5A and 5B illustrate the writing of a first bit of data to the semiconductor device of FIG. 3 by using a memory programming method according to example embodiments.
Figure 5B:
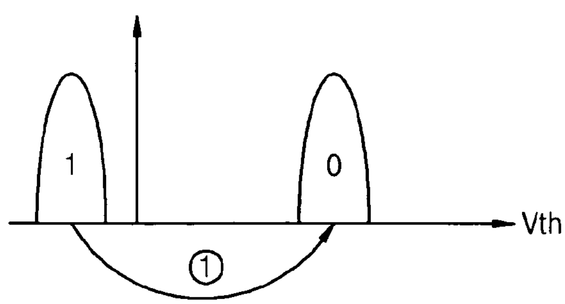

FIGS. 5A and 5B illustrate writing of a first bit of data to the semiconductor device of FIG. 3 by using a memory programming method according to example embodiments.

Referring to FIG. 5A, a controller CTRL may transmit a first bit BIT1 of data to a page buffer PB1 corresponding to a first mat MAT1 and a page buffer PB2 corresponding to a second mat MAT2 via a data bus DATABUS. The page buffers PB1 and PB2 may transmit the first bit BIT1 to banks BANK1 and BANK2 belonging to the first mat MAT1 and banks BANK3 and BANK4 belonging to the second mat MAT2. The bits of the data may be simultaneously transmitted to the banks BANK1, BANK2, BANK3, and BANK4. The bits of the data may be simultaneously transmitted to the BANK1, BANK2, BANK3, and BANK4 via a plurality of bit lines. It may be preferable to erase data retained in all blocks of the semiconductor device before the blocks are programmed.

Referring to FIG. 5B, the memory cells included in the banks BANK1 through BANK4 may be programmed so that they may have a threshold voltage distribution according to the value of the transmitted first bit BIT1.

Figure 6A:
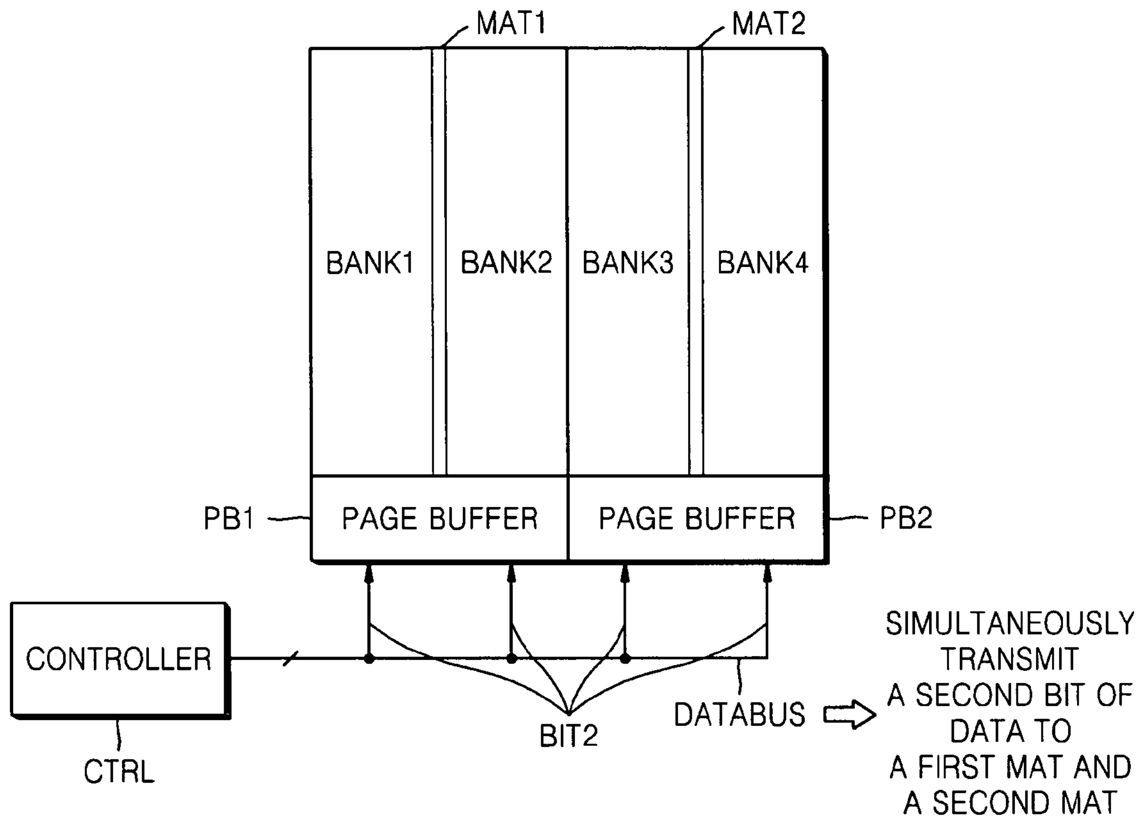
FIGS. 6A and 6B illustrate the writing of a second bit of data to the semiconductor device of FIG. 3 by using a memory programming method according to example embodiments.
Figure 6B:
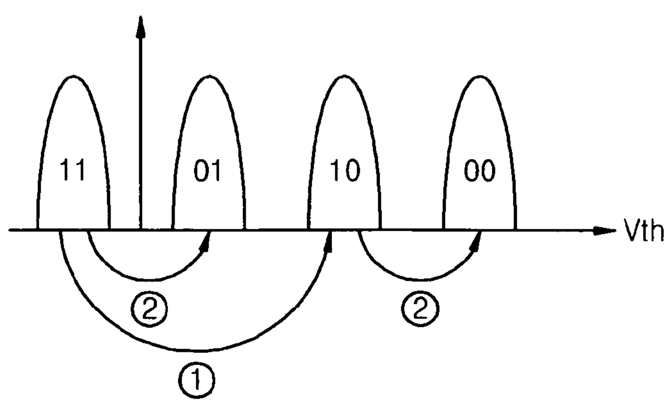

FIGS. 6A and 6B illustrate writing of a second bit of data to the semiconductor device of FIG. 3 by using a memory programming method according to example embodiments.

Referring to FIG. 6A, a controller CTRL may transmit a second bit BIT2 of data to page buffers PB1 and PB2 via a data bus DATABUS, and then the page buffers PB1 and PB2 may transmit the second bit BIT2 to banks BANK1 through BANK4 belonging to a first mat MAT1 and a second mat MAT2. The controller CTRL may transmit the first bit BIT1 illustrated in FIG. 5B and then the second bit BIT2 illustrated in FIG. 6B.

Referring to FIG. 6B, a plurality of memory cells included in banks BANK1 and BANK2 may be programmed so that they may have a threshold voltage distribution according to the value of the transmitted second bit BIT2. More specifically, the second bit BIT2 may be programmed according to a threshold voltage distribution corresponding to the value of the first bit BIT1. For example, the second bit BIT2 may be programmed from "11" to "01" if the first bit BIT1 is "1", and is programmed from "10" to "00" if the first bit BIT1 is "0".

As illustrated in FIG. 4, the memory programming method according to example embodiments may further include storing information indicating that the first bit of the data has been written (operation S420) after writing the first bit (operation S410), and storing information indicating that the second bit of the data has been written (operation S460) after writing the second bit (operation S440). Thus, it may be possible to determine a number of bits of data being written to a memory block group, based on the stored information.

For example, the stored information may be used for verification of the data. In detail, the memory programming method according to example embodiments may further include verifying the written first bit (operation S430) after writing the first bit (operation S410), and verifying the written second bit (operation S460) after writing the second bit (operation S440). In example embodiments only the bit(s) stored in the preceding operation may be verified during each of the verification of the first bit and the verification of the second bit. Thus, after writing the first bit, the first bit may be verified alone without verifying the second bit during the verification of the first bit. This may reduce the time required for data verification. Each of the memory blocks of a semiconductor device according to example embodiments may include a flag cell in order to store information indicating the number of bits of data being written. The flag cell may store information indicating the number of bits of the data being written in the memory block to which the flag cell belongs. The information may be "0" before data is written in the memory block, may be "1" after the first bit of data is written in the memory block, and may be "2" after the second bit of data is written in the memory block.

Figure 7:
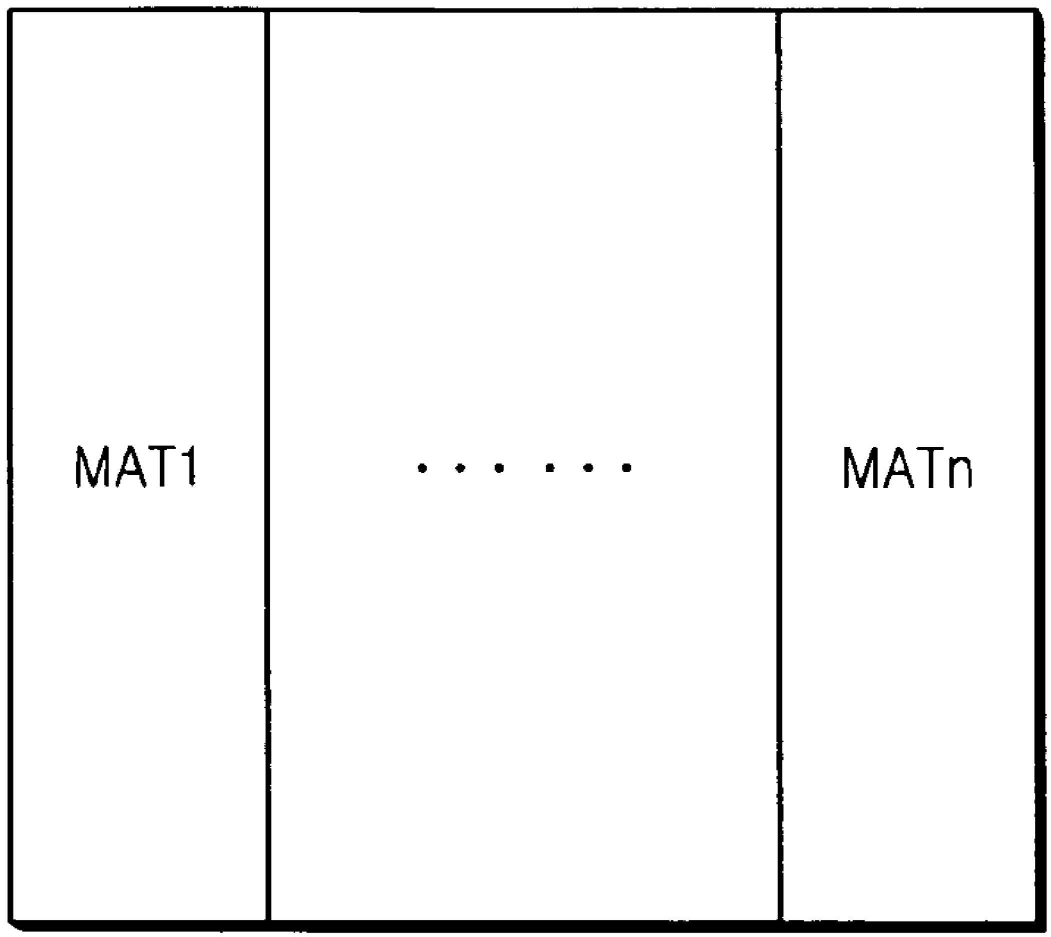
FIG. 7 is a block diagram of a semiconductor device having n mats according to example embodiments.

The memory programming method according to example embodiments has been described above with respect to a semiconductor device having two mats but may be applied to a semiconductor device having three or more mats, e.g., a semiconductor device having n mats illustrated in FIG. 7. In the memory programming method according to example embodiments, a first bit of data may be simultaneously written to all n memory mats and then a second bit of the data may be simultaneously written thereto.

Also, in the memory programming method according to example embodiments, after completing writing data to two or more memory block groups, it may be possible to simultaneously write a first bit of data to the other two or more memory block groups and then a second bit of the data thereto. For example, the first bit may be simultaneously written to the first and second mats MAT1 and MAT2 and then the second bit may be simultaneously written thereto. Then the first bit may be simultaneously written to a third mat (not shown) and a fourth mat (not shown) and then the second bit may be simultaneously written thereto. Also, in the memory programming method according to example embodiments, writing may be continuously performed on every two or more memory block groups and may be repeated until writing to all n memory groups is completed. For example, writing may be performed on a first and second memory block group, then a third and fourth memory block group. Finally writing may be performed on an n−1th and nth memory block group.

Also, it would be apparent to those of ordinary skill in the art that writing may be performed on more than every two memory block groups in the memory programming method according to example embodiments. For example, writing may be simultaneously performed on every three memory block groups or even all memory block groups. Furthermore, writing may be simultaneously performed on a plurality of memory blocks belonging to one memory block group. Also, the number of memory block groups on which writing is to be simultaneously performed at a time may fluctuate. For example, writing may be simultaneously performed on two memory block groups and then on three memory block groups.

Although memory programming methods according to example embodiments have been described with respect to storing two bits of data to a memory block, three or more bits of data may be stored thereto. For example, a first bit of data may be simultaneously stored in a first memory block group and a second memory block group, and then a second bit of the data may be simultaneously stored thereto. Next, a third bit of the data may be simultaneously stored in the first and second memory block groups and then a fourth bit of the data may be simultaneously stored thereto.

The memory programming method according to example embodiments may also be applied to a semiconductor device having both single-level memory blocks each including a plurality of single-level cells (SLCs), and multi-level memory blocks, each including a plurality of multi-level cells (MLCs). In example embodiments, a first bit of data may be written to all the multi-level cells included in the respective multi-level memory blocks and then a second bit of the data may be written thereto. Additional bits may be written in the same manner as the first and second bits if the MLCs store more than 2 bits of data. A general programming method may be applied to the single-level memory blocks.

In the memory programming method according to example embodiments, a least significant bit (LSB) may first be written and then a most significant bit (MSB) may be written. For example, the above first and second bits of the data may be the LSB and the MSB, respectively.

A plurality of memory cells included in memory blocks of a semiconductor device to which the memory programming method according to example embodiments may be applied, may be multi-level flash memory cells capable of storing M bits of data. Also, memory cells included in a memory block may have $2^M$ threshold voltage distributions which may be divided according to a threshold voltage. For example, FIG. 6B illustrates four threshold voltage distributions that a multi-level flash memory cell may have. The multi-level flash memory cell having four threshold voltage distributions may store two bits of data.

A memory programming method according to example embodiments in which M bits of data are written to each of a plurality of memory blocks, may include a data division operation and a data writing operation (M is a natural number). In the data division operation, a plurality of memory blocks may be divided into a plurality of memory block groups. The data writing operation may be respectively performed on each of the memory block groups by writing an $i^{th}$ bit of data to all memory blocks included in each of the memory block groups and then an $i+1^{th}$ bit of the data thereto (i is a natural number less than M). As illustrated in FIG. 7, a plurality of memory blocks may be divided into n mats MAT1 through MATn in the data division operation.

Alternatively, in the data writing operation, the $i^{th}$ or $i+1^{th}$ bit of the data may be simultaneously written to all the memory blocks included in each of the memory block groups. For example, the $i^{th}$ or $i+1^{th}$ bit of the data may be simultaneously written to all memory blocks in all memory block groups. Also, the $i^{th}$ or $i+1^{th}$ bit of the data may be simultaneously written to all memory blocks in two or more memory block groups.

A memory programming method according to example embodiments may further include storing information indicating the number of bits of data being written to a memory block group. In example embodiments, it may be possible to verify only bits of data currently being stored during the storing of the information.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A memory programming method in which several bits of data are written to a plurality of memory blocks, the method comprising:

dividing the plurality of memory blocks into a plurality of memory block groups, each of the memory blocks including a plurality of multi-level cells (MLCs); and writing the data to the plurality of memory block groups by writing a first bit of the data to the plurality of MLCs of two or more memory block groups from among the plurality of memory block groups, and writing a second bit of the data to the plurality of MLCs of the two or more memory blocks from among the plurality of memory block groups.

2. The method in claim 1, wherein M bits of the data are written to the plurality of memory blocks, and wherein the writing of the data to the plurality of memory block groups includes simultaneously writing an $i^{th}$ bit of the data to two or more memory block groups from among the plurality of memory block groups, and then writing an $i+1^{th}$ bit of data to the two or more memory block groups from among the plurality of memory block groups, where i is a natural number less than M, and M is a natural number.

3. The method of claim 2, wherein the writing of the data comprises simultaneously writing the $i^{th}$ bit to all memory block groups in the plurality of memory block groups, and then simultaneously writing the $i+1^{th}$ bit to all memory block groups in the plurality of memory block groups.

4. The method of claim 2, wherein the writing of the data comprises completing the simultaneous writing of the data to the two or more memory block groups from among the plurality memory block groups, then simultaneously writing the $i^{th}$ bit of the data and then the $i+1^{th}$ bit of the data to another two or more memory block groups from among the plurality of memory block groups.

5. The method of claim 4, wherein the writing is continuously performed on every two or more memory block groups until writing to all memory block groups in the plurality of memory block groups is completed.

6. The method of claim 2, further comprising storing information indicating a number of bits of the data being written to each memory block group in the plurality of memory block groups.

7. The method of claim 6, further comprising verifying only the bits of the data stored during the storing of the information.

8. The method of claim 2, wherein a least significant bit is first written and then a most significant bit is written.

9. The method of claim 2, wherein each memory block group in the plurality of memory block groups comprises a plurality of banks each including at least one memory block.

10. The method of claim 2, wherein each memory block group in the plurality of memory block groups is a mat having a plurality of banks.

11. The method of claim 2, wherein memory cells included in the plurality of memory blocks are multi-level flash memory cells for storing the M bits of the data.

12. The method in claim 1, wherein there are two memory block groups in the plurality of memory block groups, and wherein writing data to the two memory block groups simultaneously includes simultaneously writing a first bit of the data to the two memory block groups, and simultaneously writing a second bit of the data to the two memory block groups.

13. The method in claim 1, wherein M bits of the data are written to the plurality of memory blocks, and wherein writing data to the plurality of memory block groups includes individually writing the data to memory block groups in the plurality of memory block groups by writing an $i^{th}$ bit of the data to all memory blocks included in each memory block group in the plurality of memory block groups and then writing an $i+1^{th}$ bit of the data to all the memory blocks included in each memory block group in the plurality of memory block groups, where i is a natural number less than M, and M is a natural number.

14. The method of claim 13, wherein the writing of the data comprises simultaneously writing the $i^{th}$ or $i+1^{th}$ bit of the data to all memory blocks included in each memory block group in the plurality of memory block groups.

15. The method of claim 13, wherein the writing of the data is sequentially performed on the plurality of memory block groups.

16. A non-volatile semiconductor device comprising:

a plurality of memory block groups each including a plurality of multi-level memory blocks, each of the multi-level memory blocks including a plurality of multi-level cells (MLCs); and a controller for simultaneously writing an $i^{th}$ bit of data to the plurality of MLCs of two or more multi-level memory block groups from among the plurality of multi-level memory block groups, and then writing an $i+1^{th}$ bit of the data to the plurality of MLCs of the two or more multi-level memory block groups from among the plurality of multi-level memory block groups.

17. The non-volatile semiconductor device of claim 16, wherein each of the plurality of memory blocks comprises a flag cell for storing information indicating a number of bits of the data being written to each of the plurality of memory blocks.

18. The non-volatile semiconductor device of claim 17, further comprising a plurality of buffers which correspond to the plurality of memory block groups, and are configured to receive bits of the data and transmit the bits to corresponding memory block groups from among the plurality of memory block groups.

19. The non-volatile semiconductor device of claim 18, further comprising a plurality of bit lines being connected to the plurality of memory blocks, wherein the plurality of page buffers are configured to simultaneously transmit the bits of the data via the plurality of bit lines.

20. The non-volatile semiconductor device of claim 16, wherein the plurality of memory block groups further comprises:

single-level memory blocks each including a plurality of single-level cells.

21. A programming method of a non-volatile memory device having a plurality of memory block groups, each having at least one memory block, the method comprising:

writing a first data bit to all of a plurality of multi level cells in a first memory block group in the plurality of memory block groups; and writing a second data bit to at least one of the plurality of multi level cells in the first memory block group in the plurality of memory block groups.

* * * * *